(12) United States Patent
Napetschnig et al.

(10) Patent No.: US 11,764,176 B2
(45) Date of Patent: Sep. 19, 2023

(54) SEMICONDUCTOR DEVICE INCLUDING BONDING PAD METAL LAYER STRUCTURE

(71) Applicant: Infineon Technologies AG, Neubiberg (DE)

(72) Inventors: Evelyn Napetschnig, Diex (AT); Jens Brandenburg, Munich (DE); Christoffer Erbert, St. Magdalen (AT); Joachim Hirschler, Villach (AT); Oliver Humbel, Maria Elend (AT); Thomas Rupp, Faak am See (AT); Carsten Schaeffer, Annenheim (AT); Julia Zischang, Villach (AT)

(73) Assignee: Infineon Technologies AG, Neubiberg (DE)

( * ) Notice: Subject to any disclaimer, the term of this patent is extended or adjusted under 35 U.S.C. 154(b) by 21 days.

(21) Appl. No.: 17/400,303

(22) Filed: Aug. 12, 2021

(65) Prior Publication Data

US 2022/0059477 A1    Feb. 24, 2022

(30) Foreign Application Priority Data

Aug. 18, 2020 (DE) .......................... 102020121624.6
Jul. 22, 2021 (DE) .......................... 102021118992.6

(51) Int. Cl.
*H01L 23/48*    (2006.01)
*H01L 23/52*    (2006.01)
(Continued)

(52) U.S. Cl.
CPC ............ *H01L 24/05* (2013.01); *H01L 23/485* (2013.01); *H01L 23/53219* (2013.01); *H01L 23/53233* (2013.01)

(58) Field of Classification Search
CPC . H01L 24/05; H01L 23/485; H01L 23/53219; H01L 23/53233; H01L 24/45; H01L 24/49; H01L 2224/04042; H01L 2224/05027; H01L 2224/05559; H01L 2224/05568; H01L 2224/05572;
(Continued)

(56) References Cited

U.S. PATENT DOCUMENTS

2003/0102563 A1    6/2003   Mercado et al.
2004/0070042 A1*   4/2004   Lee .......................... H01L 24/48
                                                        257/459
(Continued)

FOREIGN PATENT DOCUMENTS

DE        102006043133 A1    3/2008

*Primary Examiner* — Theresa T Doan
(74) *Attorney, Agent, or Firm* — Murphy, Bilak & Homiller, PLLC

(57) ABSTRACT

A semiconductor device is proposed. The semiconductor device includes a wiring metal layer structure. The semiconductor device further includes a dielectric layer structure arranged directly on the wiring metal layer structure. The semiconductor device further includes a bonding pad metal layer structure arranged, at least partly, directly on the dielectric layer structure. A layer thickness of the dielectric layer structure ranges from 1% to 30% of a layer thickness of the wiring metal layer structure. The wiring metal layer structure and the bonding pad metal structure are electrically connected through openings in the dielectric layer structure.

18 Claims, 4 Drawing Sheets

(51) Int. Cl.
*H01L 23/00* (2006.01)
*H01L 23/485* (2006.01)
*H01L 23/532* (2006.01)

(58) Field of Classification Search
CPC . H01L 2224/45124; H01L 2224/48463; H01L 2924/13091
USPC .......................................................... 257/762
See application file for complete search history.

(56) References Cited

U.S. PATENT DOCUMENTS

| | | | |
|---|---|---|---|
| 2006/0097407 A1 | 5/2006 | Ito | |
| 2007/0205520 A1* | 9/2007 | Chou | ...................... H01L 24/12 257/E23.129 |
| 2007/0224805 A1* | 9/2007 | Oota | ....................... H01L 24/78 438/618 |

* cited by examiner

SEMICONDUCTOR DEVICE INCLUDING BONDING PAD METAL LAYER STRUCTURE

TECHNICAL FIELD

The present disclosure is related to semiconductor devices, in particular to semiconductor devices including a bonding pad metal layer structure.

BACKGROUND

Semiconductor device technologies are aiming for better efficiency and higher reliability requirements for products including power semiconductor devices such as chips including insulated gate bipolar transistors (IGBTs) or diodes. The semiconductor devices, e.g. modules or molded packages, shall implement even higher current densities and lower resistance while shrinking in size. Shrinking semiconductor devices is accompanied by an increase of bond feet density. Wire bonds may be limited in current density due to material heat up in combination with thermal expansion of the wire bond material used, e.g. aluminum (Al).

Power cycling and temperature cycling are common thermal acceleration tests used in assessing reliability of semiconductor devices. Power cycling tests are accelerated tests where the power to the semiconductor devices is switched (on and off) so that the temperature in the device would vary (cycle). Power cycling tests include conduction and switching and are close to actual operation the device.

Power cycling capabilities of semiconductor devices may be limited by the metal pad/wire bond connection. For example, mechanical parameters of the pad and the wire, e.g. hardness, cannot be tuned freely and there are limitations for the maximum energy applied to the system to ensure a robust interconnect. Undesired cracks may arise at the wire to pad interface propagating during power cycling.

It is desirable to improve reliability of a semiconductor device and to provide a manufacturing method thereof.

SUMMARY

An example of the present disclosure relates to a semiconductor device. The semiconductor device includes a wiring metal layer structure. The semiconductor device further includes a dielectric layer structure arranged directly on the wiring metal layer structure. The semiconductor device further includes a bonding pad metal layer structure arranged, at least partly, directly on the dielectric layer structure. A layer thickness of the dielectric layer structure ranges from 1% to 30% of a layer thickness of the wiring metal layer structure. The wiring metal layer structure and the bonding pad metal structure are electrically connected through openings in the dielectric layer structure. The bonding pad metal layer structure is composed of aluminum by at least 50% of the amount of substance.

Another example of the present disclosure relates to a method of manufacturing a semiconductor device. The method includes forming a wiring metal layer structure. The method further includes forming a dielectric layer structure arranged directly on the wiring metal layer structure. The method further includes forming a bonding pad metal layer structure arranged, at least partially, directly on the dielectric layer structure. A layer thickness of the dielectric layer structure ranges from 1% to 30% of a layer thickness of the wiring metal layer structure. The wiring metal layer structure and the bonding pad metal structure are electrically connected through openings in the dielectric layer structure. The bonding pad metal layer structure or a portion thereof is comprising Al (aluminum) by at least 50% of the amount of substance.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of semiconductor devices, e.g. vertical power semiconductor devices and together with the description serve to explain principles of the embodiments. Further embodiments are described in the following detailed description and the claims.

DETAILED DESCRIPTION

Figure 1:
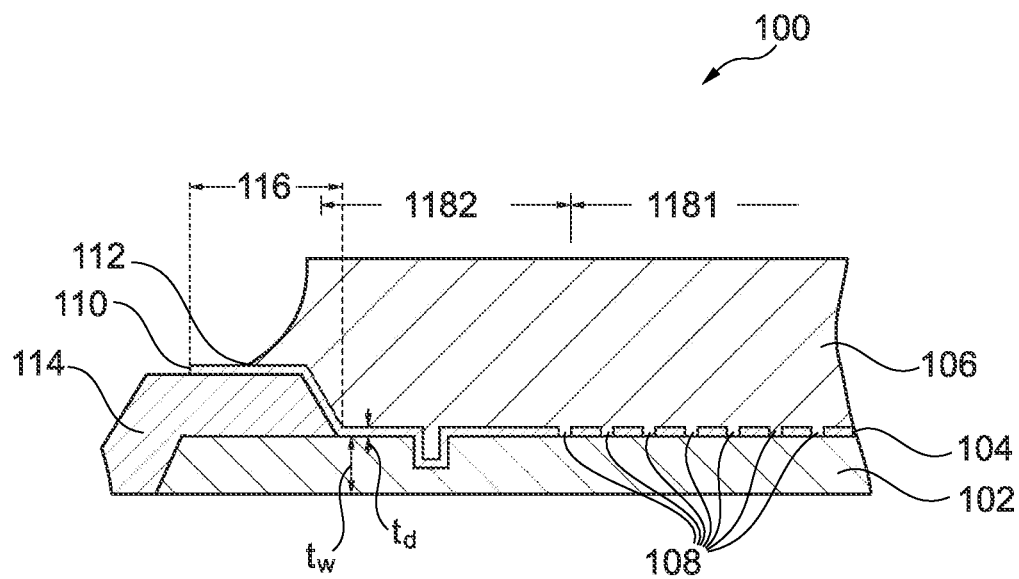
FIG. 1 is a schematic cross-sectional view for illustrating an example of a semiconductor device including a dielectric layer structure arranged between a wiring metal layer structure and a bonding pad metal layer structure.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

Ranges given for physical dimensions include the boundary values. For example, a range for a parameter y from a to b reads as a≤y≤b. A parameter y with a value of at least c reads as c≤y and a parameter y with a value of at most d reads as y≤d.

The term "on" is not to be construed as meaning only "directly on". Rather, if one element is positioned "on" another element (e.g., a layer is "on" another layer or "on" a substrate or semiconductor body), a further component (e.g., a further layer) may be positioned between the two elements (e.g., a further layer may be positioned between a layer and a substrate if the layer is "on" said substrate).

An example of a semiconductor device may include a wiring metal layer structure. The semiconductor device may further include a dielectric layer structure arranged directly on the wiring metal layer structure. The semiconductor device may further include a bonding pad metal layer structure arranged, at least partly, directly on the dielectric layer structure. A layer thickness of the dielectric layer structure may range from 1% to 30%, or from 3% to 25%, or from 5% to 20%, or from 5% to 15%, or from 10% to 20% of a layer thickness of the wiring metal layer structure. The wiring metal layer structure and the bonding pad metal structure may be electrically connected through openings in the dielectric layer structure.

The bonding pad metal layer structure or a portion of the bonding pad metal layer structure may be composed of aluminum by at least 50%, by at least 70%, by at least 85%, or even by at least 94% of the amount of substance. The amount of substance may refer to the number of atoms within the bonding pad metal layer structure. For example, at least 50%, at least 70%, at least 85%, or even at least 94% of the atoms within the bonding pad metal layer structure or the portion thereof may be aluminum atoms.

The wiring metal layer structure or a portion of the wiring metal layer structure may be composed of aluminum by at least 50%, by at least 70%, by at least 85%, or even by at least 94% of the amount of substance. The amount of substance may refer to the number of atoms within the wiring metal layer structure. For example, at least 50%, at least 70%, at least 85%, or even at least 94% of the atoms within the wiring metal layer structure or the portion thereof may be aluminum atoms.

The semiconductor device may be an integrated circuit, or a discrete semiconductor device or a semiconductor module, for example. The semiconductor device may be or include a power semiconductor device, e.g. a vertical power semiconductor device having a load current flow between a first load terminal at a first side of the device and a second load terminal at a second side opposite to the first side, or a lateral power semiconductor device having a load current flow between load terminals at a same side of the device. The semiconductor device may be or include a power semiconductor IGBT (insulated gate bipolar transistor), or a power semiconductor reverse conducting (RC) IGBT or a power semiconductor transistor such as a power semiconductor IGFET (insulated gate field effect transistor, e.g. a metal oxide semiconductor field effect transistor), or a power semiconductor diode. The power semiconductor device may be configured to conduct currents of more than 1 A or more than 10 A or even more than 30 A, and may be further configured to block voltages between load terminals, e.g. between emitter and collector of an IGBT, or between drain and source of a MOSFET in the range of several hundreds of up to several thousands of volts, e.g. 400 V, 650V, 1.2 kV, 1.7 kV, 3.3 kV, 4.5 kV, 5.5 kV, 6 kV, 6.5 kV. The blocking voltage may correspond to a voltage class specified in a datasheet of the power semiconductor device, for example.

The wiring metal layer structure may be arranged over a semiconductor body that may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For example, the semiconductor body may be a magnetic Czochralski, MCZ, or a float zone (FZ) or an epitaxially deposited silicon semiconductor body.

For example, the wiring metal layer structure may correspond to or be part of one wiring level of a wiring area over the semiconductor body or semiconductor substrate. In some examples, the one wiring level including the wiring metal layer may be located closest to the semiconductor body in case of multiple wiring levels. In some other examples, one or more further wiring levels may be arranged between the one wiring level including the wiring metal layer and the semiconductor body. The wiring area may include two, three, four or even more wiring levels. Each wiring level may be formed by a single one or a stack of conductive layers, e.g. metal layer(s) and/or highly doped semiconductor materials such as highly doped polycrystalline silicon. Some or all of the wiring levels may be lithographically patterned, for example. By patterning wiring levels, any or any combination of wiring lines, bond pads, contact areas may be formed. Between stacked wiring levels, an intermediate dielectric may be arranged. Contact plug(s) and/or contact line(s) may be formed in openings in the intermediate dielectric to electrically connect parts, e.g. wiring lines or contact areas, of different wiring levels to one another. A dielectric layer may also be arranged between the semiconductor body and the wiring level closest to the semiconductor body, for example. Contact plug(s) and/or contact line(s) may be formed in openings in the dielectric layer to electrically connect parts, e.g. wiring lines or contact areas, of the wiring level closest to the semiconductor body and active areas in the semiconductor body, e.g. doped regions in the semiconductor body such as anode or cathode regions of a diode, or emitter, base or collector regions of an IGBT or source, body or drain regions of an IGFET.

Similar to the wiring metal layer structure, the bonding pad metal layer structure may correspond to or be part of another wiring level of the wiring area over the semiconductor body or semiconductor substrate. The wiring level of the bonding pad metal layer structure may have a larger vertical distance from the semiconductor body than the wiring level of the wiring metal layer structure, for example. For example, the bonding pad metal layer structure may be part or correspond to the metal wiring level that has a largest vertical distance to the semiconductor body among the wiring levels in the wiring area, for example. For example, the bonding pad metal layer structure may be a continuous metal structure.

The dielectric layer structure may include one layer or a combination of layers, e.g. a layer stack of dielectric layers, for example oxide layers such as thermal oxide layers or deposited oxide layers, e.g. undoped silicate glass (USG), phosphosilicate glass (PSG), boron silicate glass (BSG), borophosphosilicate glass (BPSG), oxynitride or nitride layers, high-k dielectric layers or low-k dielectric layers, undoped or intrinsic semiconductor materials such as undoped polycrystalline silicon. The dielectric layer structure may constitute or form part of one intermediate dielectric level vertically arranged between wiring levels. In some examples, the formation methods of the dielectric layer structure include physical vapor deposition (PVD), chemical vapor deposition (CVD), plasma-enhanced CVD (or PECVD), spin-on, and other applicable methods.

A layer thickness of any layer of the wiring area, e.g. the dielectric layer structure, or the bonding pad metal layer structure, or the wiring metal layer structure, may correspond to a vertical extension of the respective layer, e.g. measured along a vertical direction that is perpendicular to a main surface level of the semiconductor body.

The dielectric layer structure may act as a stress absorbing and structural tuning layer, for example. While typical intermediate dielectric layers focus on electric isolation between the adjacent wiring levels, the dielectric layer structure is thinner and shall enable a low resistive electric connection between the bonding pad metal layer structure and the wiring metal layer structure.

Moreover, the dielectric layer structure may enable a number of technical benefits as will be described below.

For example, the dielectric layer structure may serve as an etch stop layer when forming the bonding pad metal layer structure by patterning the respective wiring level. Hence, this may allow for having thicker metallization in required areas, e.g. bond pads, and protect metal wiring further below, e.g. the wiring level including the wiring metal layer structure, from etching. Thereby, metal structures in the kerf, e.g. process control monitor, PCM-structures, or in non-bond pad areas, e.g. metal routing or gate runner, may be formed with merely a thickness of the wiring layer including the metal wiring layer structure only, provided that the dielectric layer is formed thick enough to provide for a sidewall coverage of the covered structures. Thereby, sawing through the structures becomes possible and the implementation of a double kerf or block PCMs, which reduce the amount of active area per wafer and increase chip cost, can be avoided. Non-bond pad metal structures on the chip used e.g. for routing can remain at a thickness of the wiring metal layer structure only. Thus, the requirement for modifying critical dimensions may be reduced. The possibility to separately pattern the wiring metal layer structure and the bonding pad metal layer structure may also facilitate the use of thick hard passivation layer(s), since the passivation layer(s) may only cover the topological step up to a thickness of the wiring metal layer structure. Thereby, formation of thinned passivation areas, cracks, and layer interruptions appearing at high topography steps may be avoided.

The dielectric layer structure in between the wiring metal layer structure and the bonding pad metal layer structure may be tuned individually. For example, the dielectric layer structure may absorb bond forces as the dielectric layer structure is thick enough to be of mechanical relevance. The layout may be adapted to the requirements of different bond processes, e.g. wire material, bond feet amount.

As only a part of an interface between the wiring metal layer structure and the bonding pad metal layer structure is covered with the dielectric layer structure, there is no or negligible reduction of current flow even though a thickness of the dielectric layer structure is too thick to be conductive. A thickness of the dielectric layer structure may be balanced to provide sufficient buffer capability for bond forces while the deposition of the bonding pad metal layer structure is still possible without void formation. Thus, a thickness of the dielectric layer structure may depend from a layout of an inner part, e.g. central part, of the dielectric layer structure.

Provision of the dielectric layer structure may allow for reducing a grain size of the material of the bonding pad metal layer structure compared to a single thick metallization layer. If an aluminum based metallization layer is deposited the average grain size grown during metal anneal may be in the range of the full layer thickness. A thick metal layer deposited without any intermediate layer may have a larger average grain size than a stack having the dielectric layer structure between the wiring metal layer structure and the bonding pad metal layer structure, for example. Moreover, edges, corners and topography of the patterned dielectric layer structure may act as starting points for metal grain growth. This may result in smaller grains and a higher total number of metal grains. This may again improve the absorption capability of bond forces. In view of flexibility of design of the dielectric layer structure, symmetries may be set up for enabling specific tuning of the grain size and grain orientation of the bonding pad metal layer structure, for example.

At an overlap area between the bonding pad metal layer structure and a passivation layer structure an intermediate dielectric, e.g. a protective dielectric frame being part of the dielectric layer structure, may be formed. This intermediate dielectric may act as an additional protection against chemistry attack or ionic contamination out of the package.

For example, the layer thickness of the dielectric layer structure may range from 50 nm to 1 μm. For example, the layer thickness of the dielectric layer structure may be smaller than 500 nm.

For example, a lateral end of the dielectric layer structure may laterally protrude a lateral end of the bonding pad metal layer structure. This may allow the dielectric layer structure to serve as an etch stop layer when forming the bonding pad metal layer structure by patterning the respective wiring level.

For example, the semiconductor device may further include a passivation layer structure arranged between the dielectric layer structure and the wiring metal layer structure in a peripheral part of the dielectric layer structure. The peripheral part may partly or completely laterally surround the dielectric layer structure, for example. The passivation layer structure may cover edge portions of the wiring metal layer structure, for example. The passivation layer structure is formed to protect the integrated circuit elements or discrete semiconductor device formed in the semiconductor body and also the edge portions of the wiring metal layer structure. In some examples, the passivation layer structure is a hermetic layer to prevent moisture from contacting the device elements, e.g. pn-junctions or wirings. In some examples, the passivation layer structure is formed of any or any combination of polymer (such as polyimide or polybenzoxazole), oxide, oxynitride, nitride, or other dielectric materials. In some examples, additional passivation layers are formed over the wiring area (not shown) and at the same level, or over, the bonding pad metal layer structure. In some examples, the passivation layer structure has a thickness in a range from about 0.1 μm to about 3 μm. In some examples, the formation methods include physical vapor deposition (PVD), chemical vapor deposition (CVD), plasma-enhanced CVD (or PECVD), spin-on, and other applicable methods.

For example, at least one of the wiring metal layer structure or the bonding pad metal layer structure (typically, the wiring metal layer structure and the bonding pad metal layer structure) may comprise at least one of: a pure metal, a metal alloy, or a metal compound. In some examples, the wiring metal layer and/or the bonding pad metal layer structure may consist (except for impurities) of a pure metal, a metal alloy, or a metal compound. The wiring metal layer structure and/or the bonding pad metal layer structure may comprise or may be a metal layer stack. For example, the wiring metal layer structure and/or the bonding pad metal layer structure may comprise at least one of: Al, Cu, an aluminum copper alloy (e.g. AlCu), AlSi, or AlSiCu. Typically, the wiring metal layer structure and/or the bonding pad metal layer structure comprise aluminum. The wiring metal layer structure and/or the bonding pad metal layer structure may comprise the same metal compound or a different metal compound.

For example, the wiring metal layer structure or the portion thereof includes a first metal compound of at least Cu and Al, or AlSiCu.

For example, the bonding pad metal layer structure or the portion thereof includes a second metal compound of at least Cu and Al. The first metal compound and the second metal compound may be the same or different.

For example, the wiring metal layer structure or the portion thereof includes AlSiCu, and the bonding pad metal layer structure or the portion thereof includes AlCu.

The first metal compound may be composed of aluminum by at least 50%, by at least 70%, by at least 85%, or even by at least 94% of the amount of substance. The second metal compound may be composed of aluminum by at least 50%, by at least 70%, by at least 85%, or even by at least 94% of the amount of substance. The amount of substance may refer to the number of atoms within the respective metal compound. For example, at least 50%, at least 70%, at least 85%, or even at least 94% of the atoms within the first metal compound may be aluminum atoms. For example, at least 50%, at least 70%, at least 85%, or even at least 94% of the atoms within the first metal compound may be aluminum atoms. The remaining percentage of atoms within the respective metal compound may, for example, be Si and/or Cu atoms.

AlCu may, for example, be a metal compound comprising only aluminum and copper. AlSiCu may, for example, be a metal compound comprising only aluminum, silicon, and copper. AlSiCu may be softer than AlCu. AlCu may exhibit a greater hardness than AlSiCu.

For example, the dielectric layer structure may be any one or any combination, e.g. stacked combination, of an oxide layer, a silicon oxynitride or nitride layer, and an undoped (e.g., unintentionally doped or intrinsic) polycrystalline silicon layer.

For example, the bonding pad metal layer structure may include a central part and a peripheral part. Any wire bond on the bonding pad metal layer structure may be located in the central part.

For example, a number of wire bonds on the bonding pad metal layer structure may be equal to two or larger, e.g. three, four, five, or even larger.

For example, the dielectric layer structure may include a closed peripheral part. For example, the dielectric layer structure may be in the form of a closed loop. The dielectric layer structure may further include one or more dielectric layer parts inside and/or at least partially surrounded by the closed loop. The one or more dielectric layer parts inside and/or surrounded by the closed loop may be laterally spaced from the closed loop and/or merge with the closed loop, for example. For example, the closed peripheral part may adjoin the peripheral part of the bonding pad metal layer structure.

For example, the dielectric layer structure may include a central part, e.g. free floating oxide structures, that is laterally spaced from the closed peripheral part by a separative opening in the dielectric layer structure. The separative opening may also be in the form of a closed loop, for example. This may allow for reducing the risk of crack propagation outside the bond pad area, e.g. passivation layers. The free floating oxide structures may be allowed to break during bonding process without impacting outside areas. The absorption of bond forces may allow for higher ultrasonic power during bonding without risk for the material of the semiconductor body, e.g. silicon, below. This may result in a broadening of a window for wire bond process conditions enabling higher power cycling capabilities, also through use of harder bond materials, e.g. AlMg.

For example, a maximum lateral extent of the openings in the central part of the dielectric layer structure may be smaller than a sum of the layer thickness of the wiring metal layer structure and the layer thickness of the bonding pad metal layer structure. The openings in the central part of the dielectric layer may be filled with conductive material, e.g. part of the conductive material of the bonding pad metal layer structure, electrically connecting the bonding pad metal layer structure and the wiring layer metal structure, for example. In some other examples, a maximum lateral extent of the openings in the central part of the dielectric layer structure may be smaller than a sum of the layer thickness of the dielectric layer structure, and the layer thickness of the wiring metal layer structure, and the layer thickness of the bonding pad metal layer structure.

For example, a minimum lateral extent of the openings in the central part of the dielectric layer structure may be equal to or larger than two times the layer thickness of the dielectric layer structure.

For example, the dielectric layer structure may cover 25% to 90%, or 35% to 80%, or 50% to 70% of a bottom of the bonding pad metal layer structure in the central part of the bonding pad metal layer structure.

An example of a method of manufacturing a semiconductor device may include forming a wiring metal layer structure. The method may further include forming a dielectric layer structure arranged directly on the wiring metal layer structure. The method may further include forming a bonding pad metal layer structure arranged, at least partially, directly on the dielectric layer structure. A layer thickness of the dielectric layer structure may range from 1% to 30% of a layer thickness of the wiring metal layer structure. The wiring metal layer structure and the bonding pad metal structure may be electrically connected through openings in the dielectric layer structure.

For example, the method may include forming a passivation layer structure on at least part of the wiring metal layer structure before forming the dielectric layer structure. In some examples, the passivation layer structure may be formed with a thickness in a range from about 0.1 μm to about 3 μm. In some examples, the passivation layer structure may be formed by one or any combination of physical vapor deposition (PVD), chemical vapor deposition (CVD), plasma-enhanced CVD (or PECVD), spin-on, and other applicable methods.

For example, forming the dielectric layer structure and forming the bonding pad metal layer structure may include forming a dielectric layer on the wiring metal layer structure and on the passivation layer structure. The dielectric layer may be patterned, e.g. by one or more masked etch process(es), in a central part of a bonding pad area. Thereafter, a bonding pad metal layer may be formed on the dielectric layer.

For example, the method may further include forming the bonding pad metal layer structure by patterning the bonding pad metal layer. Patterning the bonding pad metal layer may include an etch process using the dielectric layer as an etch stop layer.

For example, the method may further include patterning the dielectric layer in a part surrounding the central part of the bonding pad area after forming the bonding pad metal layer.

The examples and features described above and below may be combined.

Functional and structural details described with respect to the examples above shall likewise apply to the exemplary examples illustrated in the figures and described further below.

In the following, further examples of semiconductor devices are explained in connection with the accompanying drawings. Functional and structural details described with respect to the examples above shall likewise apply to the exemplary embodiments illustrated in the figures and described further below.

FIG. 1 schematically and exemplarily shows a section of a cross-sectional view of a semiconductor device 100.

The semiconductor device 100 includes a wiring metal layer structure 102. A dielectric layer structure is arranged directly on at least part of the wiring metal layer structure 102. At least part of a passivation layer structure 114 is arranged between the dielectric layer structure 104 and the wiring metal layer structure 102 in a peripheral part of the dielectric layer structure 104. A bonding pad metal layer structure 106 is arranged, at least partly, directly on the dielectric layer structure 104. The bonding pad metal layer structure 106 includes a central part 1181 and a peripheral part 1182.

The passivation layer structure 114 may be formed by patterning a dielectric layer of the dielectric layer structure 104 in a part surrounding the central part 1181 of the bonding pad metal layer structure 106 after forming a metal layer of the bonding pad metal layer structure 106.

A layer thickness td of the dielectric layer structure 104 ranges from 1% to 30%, or from 3% to 25%, or from 5% to 20%, or from 5% to 15%, or from 10% to 20% of a layer thickness tw of the wiring metal layer structure 102. The wiring metal layer structure 102 and the bonding pad metal structure 106 are electrically connected through openings 108 in the dielectric layer structure 104.

A lateral end 110 of the dielectric layer structure 104 laterally protrudes a lateral end 112 of the bonding pad metal layer structure 106.

FIGS. 2A to 2E schematically and exemplarily show a section of a plan view of a semiconductor device for illustrating exemplary layouts of the dielectric layer structure 104.

Figures 2A, 2B:
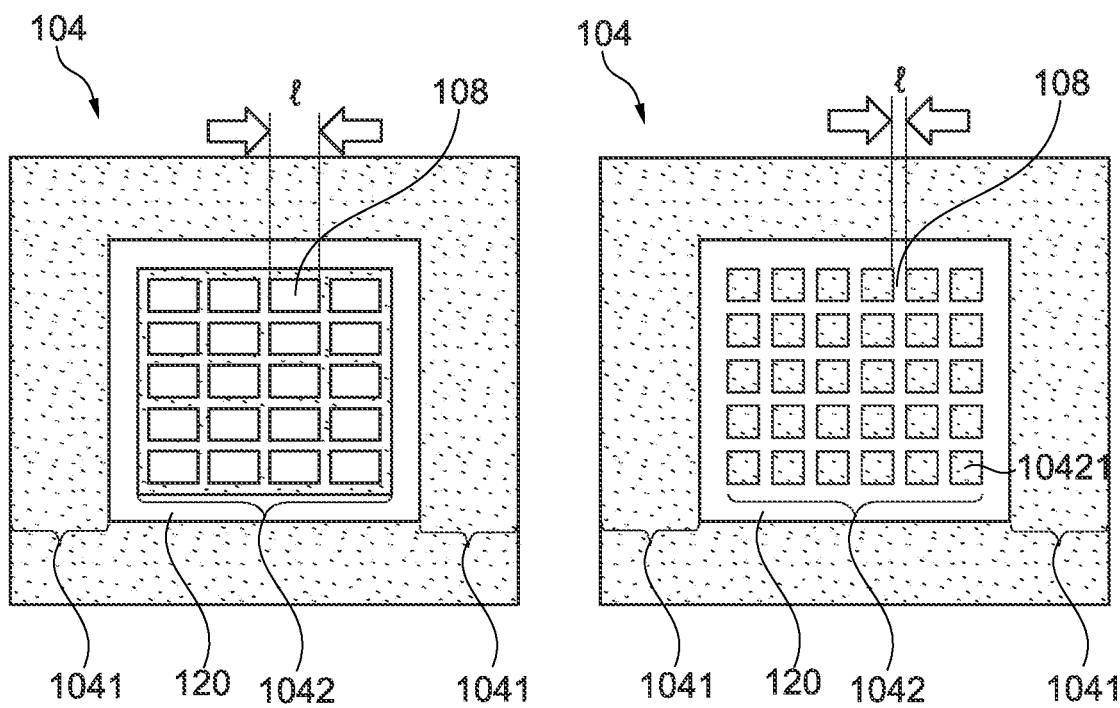
FIGS. 2A to 2E are schematic plan views for illustrating layouts of the dielectric layer structure.

Referring to the schematic plan views of FIGS. 2A, 2B, the dielectric layer structure 104 includes a central part 1042 that is laterally spaced from the closed peripheral part 1041 by a separative opening 120 in the dielectric layer structure 104. While the central part 1042 of the dielectric layer structure 104 is continuous in the example illustrated in FIG. 2A, the central part 1042 of the dielectric layer structure 104 in the example illustrated in FIG. 2B includes a plurality of dielectric islands 10421.

A maximum lateral extent 1 of the openings 108 in the central part 1042 of the dielectric layer structure 104 may be smaller than a sum of the layer thickness tw of the wiring metal layer structure 102 and a layer thickness of the bonding pad metal layer structure 106.

A coverage of a bottom of the central part 1181 of the bonding pad metal layer structure 106 with the dielectric layer structure 104 may range from 25% to 90%, or from 35% to 80%, or from 50% to 70%, for example.

Figure 2C:
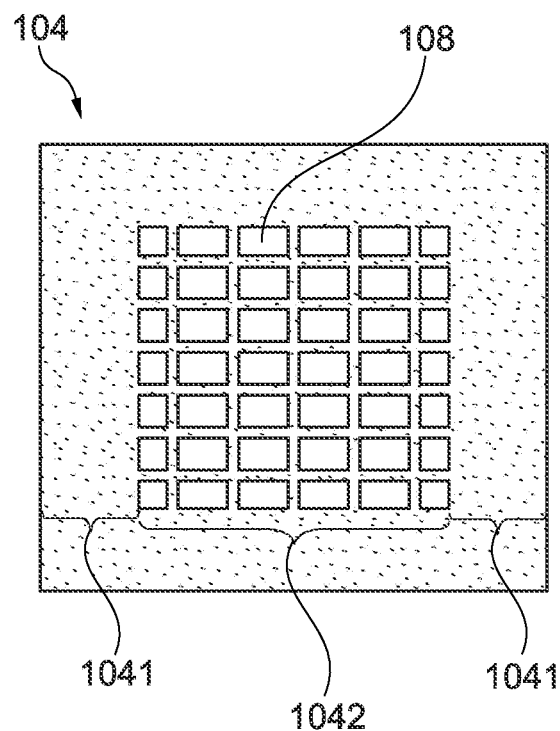
Figure 2D:
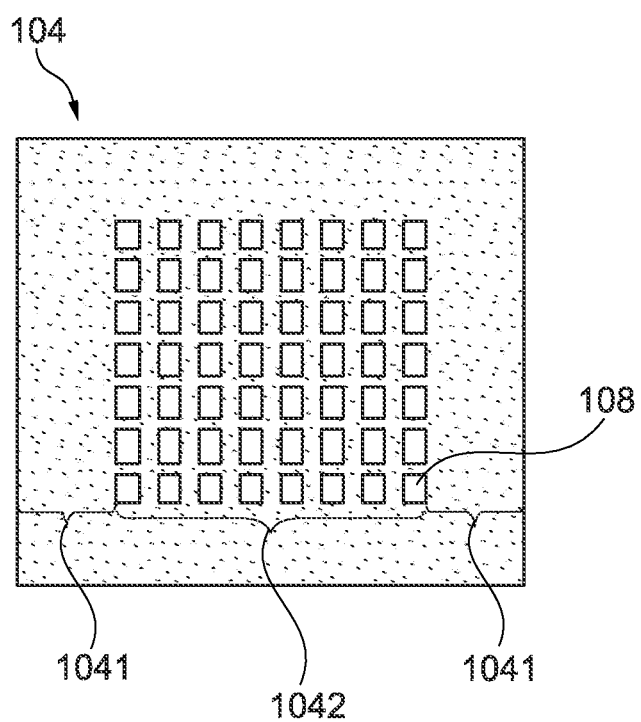
Figure 2E:
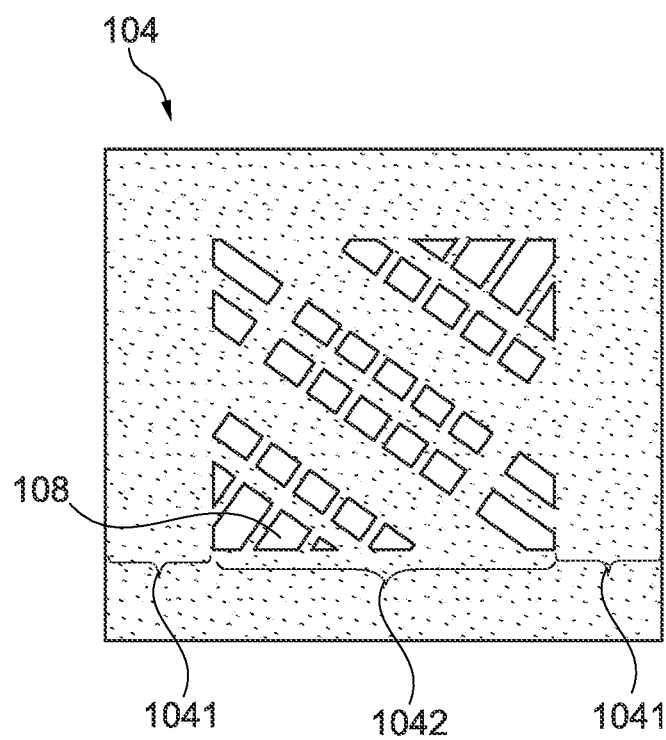

Referring to the schematic plan views of FIGS. 2C, 2D, 2E, the central part 1042 of the dielectric layer structure 104 is merged with the closed peripheral part 1041 of the dielectric layer structure 104. In some examples the openings 108 in the central part 1042 may be regularly arranged as is illustrated in FIGS. 2C, 2D. In some other examples, some openings 108 may differ from other openings with respect to shape and arrangement, for example. A layout of the central part 1041 of the dielectric layer structure 104 may be chosen with respect to mechanical stability on specific areas of the bonding pad metal layer structure 106 and/or for enabling specific grain size and orientation in the bonding pad metal layer structure 106, for example.

Figure 3A:
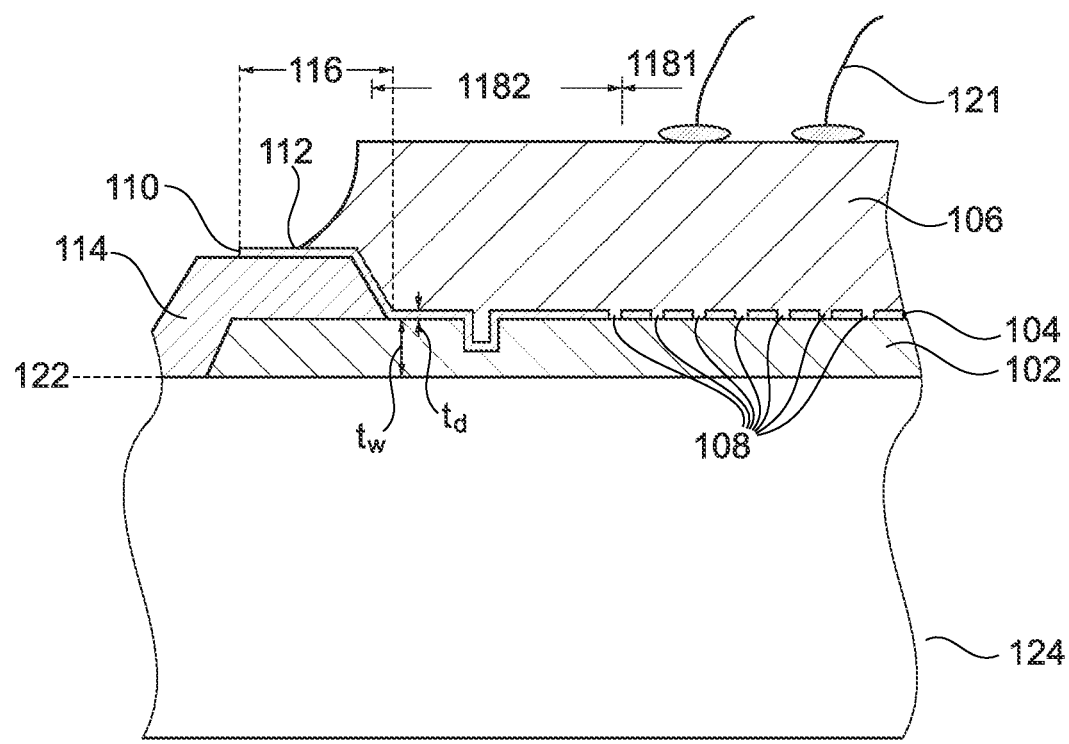
FIGS. 3A to 3C are schematic cross-sectional views for illustrating layouts of a wiring area including the wiring metal layer structure, the dielectric layer structure and the bonding pad metal layer structure on a semiconductor body.
Figure 3B:
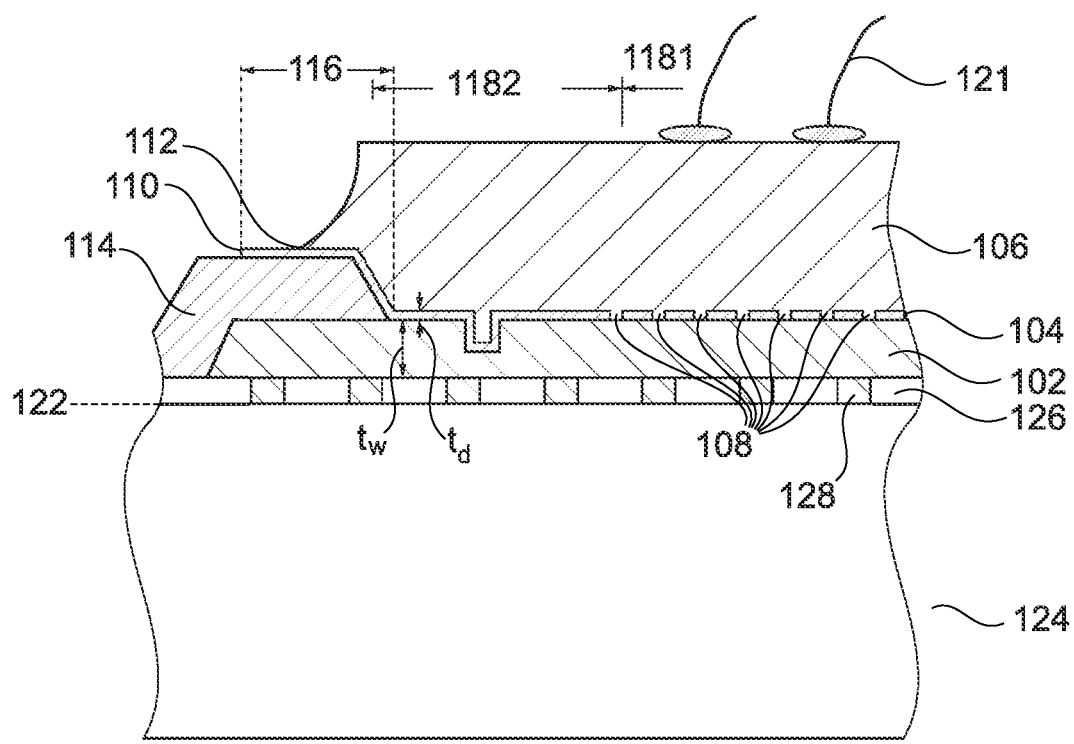
Figure 3C:
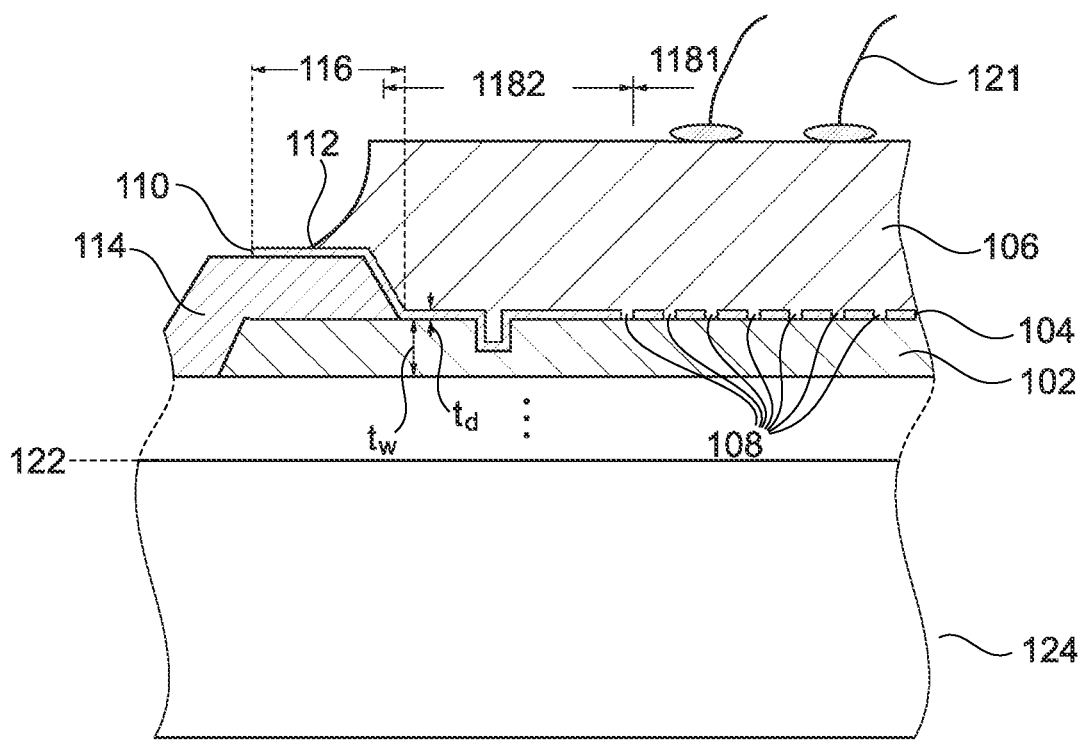

FIGS. 3A to 3C schematically and exemplarily show a section of a cross-sectional view of a semiconductor device 100 for illustrating exemplary configurations of a wiring area including the wiring metal layer structure 102, the dielectric structure 104 and the bonding pad metal layer structure 106. A number of wire bonds 121 on the bonding pad metal layer structure 106 is equal to two or larger.

In the example of FIG. 3A, the wiring metal layer structure 102 directly adjoins a surface 122 of a semiconductor body 124. In the semiconductor body 124, device elements of a discrete semiconductor or integrated circuit, e.g. doped regions, dielectrics, trenches, are formed.

In the example of FIG. 3B, an interlayer dielectric 126 is arranged between the wiring metal layer structure 102 and the surface 122 of the semiconductor body 124. Contact plugs or contact lines 128 extend through the interlayer dielectric 126 for electrically connecting the wiring metal layer structure 102 to the semiconductor body 124.

In the example of FIG. 3C, one or more interlayer dielectric(s) and one or more wiring level(s) may be arranged between the wiring metal layer structure and the surface 122 of the semiconductor body 124.

The aspects and features mentioned and described together with one or more of the previously described examples and figures, may as well be combined with one or more of the other examples in order to replace a like feature of the other example or in order to additionally introduce the feature to the other example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a wiring metal layer structure;
a dielectric layer structure arranged directly on the wiring metal layer structure; and
a bonding pad metal layer structure arranged, at least partly, directly on the dielectric layer structure,
wherein a layer thickness of the dielectric layer structure ranges from 1% to 30% of a layer thickness of the wiring metal layer structure,
wherein the wiring metal layer structure and the bonding pad metal structure are electrically connected through openings in the dielectric layer structure,
wherein the bonding pad metal layer structure or a portion of the bonding pad metal layer comprises Al by at least 50% of the amount of substance.

2. The semiconductor device of claim 1, wherein the wiring metal layer structure or a portion of the wiring metal layer structure comprises Al by at least 50% of the amount of substance.

3. The semiconductor device of claim 1, wherein the wiring metal layer structure or the portion of the wiring metal layer structure includes a first metal compound of at least Cu and Al, or AlSiCu.

4. The semiconductor device of claim 1, wherein the bonding pad metal layer structure or the portion of the bonding pad metal layer includes a second metal compound of at least Cu and Al.

5. The semiconductor device of claim 1, wherein the wiring metal layer structure or the portion of the wiring metal layer structure includes AlSiCu, and wherein the bonding pad metal layer structure or the portion of the bonding pad metal layer structure includes AlCu.

6. The semiconductor device of claim 1, wherein the layer thickness of the dielectric layer structure ranges from 50 nm to 1 µm.

7. The semiconductor device of claim 1, wherein a lateral end of the dielectric layer structure laterally protrudes from a lateral end of the bonding pad metal layer structure.

8. The semiconductor device of claim 1, further comprising a passivation layer structure arranged between the dielectric layer structure and the wiring metal layer structure in a peripheral part of the dielectric layer structure.

9. The semiconductor device of claim 1, further comprising a semiconductor body, wherein the wiring metal layer structure directly adjoins a surface of the semiconductor body.

10. The semiconductor device of claim 1, wherein the dielectric layer structure comprises any one of or any combination of an oxide layer, a silicon oxynitride layer, a nitride layer, and an undoped polycrystalline silicon layer.

11. The semiconductor device of claim 1, wherein the semiconductor device is a power semiconductor device.

12. The semiconductor device of claim 1, wherein the bonding pad metal layer structure includes a central part and a peripheral part, and wherein any wire bond on the bonding pad metal layer structure is located in the central part.

13. The semiconductor device of claim 12, wherein a number of wire bonds on the bonding pad metal layer structure is equal to two or larger.

14. The semiconductor device of claim 12, wherein the dielectric layer structure includes a closed peripheral part.

15. The semiconductor device of claim 14, wherein the dielectric layer structure includes a central part that is laterally spaced from the closed peripheral part by a separative opening in the dielectric layer structure.

16. The semiconductor device of claim 15, wherein a maximum lateral extent of the openings in the central part of the dielectric layer structure is smaller than a sum of the layer thickness of the wiring metal layer structure and the layer thickness of the bonding pad metal layer structure.

17. The semiconductor device of claim 15, wherein a minimum lateral extent of the openings in the central part of the dielectric layer structure is equal to or larger than two times the layer thickness of the dielectric layer structure.

18. The semiconductor device of claim 15, wherein the dielectric layer structure covers 25% to 90% of a bottom of the bonding pad metal layer structure in the central part of the bonding pad metal layer structure.

* * * * *